United States Patent [19]

Bénéjean

[11] Patent Number: 4,945,508

[45] Date of Patent: Jul. 31, 1990

[54] PROCESS AND DEVICE FOR SIMULATING A SYNCHRONOUS ELECTRIC MACHINE

[75] Inventor: Richard Bénéjean, Montigny le Bretonneux, France

[73] Assignee: Service Electricite de France National, Paris, France

[21] Appl. No.: 433,461

[22] Filed: Nov. 9, 1989

Related U.S. Application Data

[63] Continuation of Ser. No. 36,528, Apr. 9, 1987, abandoned.

[30] Foreign Application Priority Data

Apr. 10, 1986 [FR] France ................... 86 05141

[51] Int. Cl.$^5$ .............................................. G06G 7/63
[52] U.S. Cl. .................................. 364/802; 364/808; 364/578; 318/700
[58] Field of Search ............... 364/801, 802, 807, 808, 364/809, 578; 318/700, 716-719; 324/158 MG

[56] References Cited

U.S. PATENT DOCUMENTS 3,723,718  3/1973  Jaffe et al. ........................... 364/802
3,909,688  9/1975  Blaschke et al. ..................... 318/700
4,293,923  10/1981  Jasmin et al. ....................... 364/802

OTHER PUBLICATIONS

Keyhani–"Development of an Interactive Power System Research Simulator"–IEEE Trans. on Power Apparatus and Systems, vol. PAS-103, No. 3, Mar. 1984, pp. 516–521.

Kassakian–"Simulating Power Electronic Systems-A New Approach"–Proceedings of the IEEE, vol. 67, No. 10, Oct. 1979, pp. 1428–1439.

Primary Examiner—Joseph Ruggiero
Attorney, Agent, or Firm—Sughrue, Mion, Zinn, Macpeak & Seas

[57] ABSTRACT

This process comprises measuring chosen particular physical parameters of a synchronous rotating machine, combining said parameters with variables defining the nominal mode of operation of the machine, obtaining from said physical parameters and said variables a set of coefficients of the first matrices (A, B, C) representing the continuous state of the machine, and obtaining from said matrices a system of continuous state equations of the machine:

$$d\,/X(t)/\,/dt = A.X(t) + B.U(t)$$

$$Y(t) = C.X(t)$$

in which:
X(t) is the state vector of the system
U(t) is the input vector of the system
Y(t) is the output vector of the system.

2 Claims, 4 Drawing Sheets

FIG. 3A  FIG. 3B

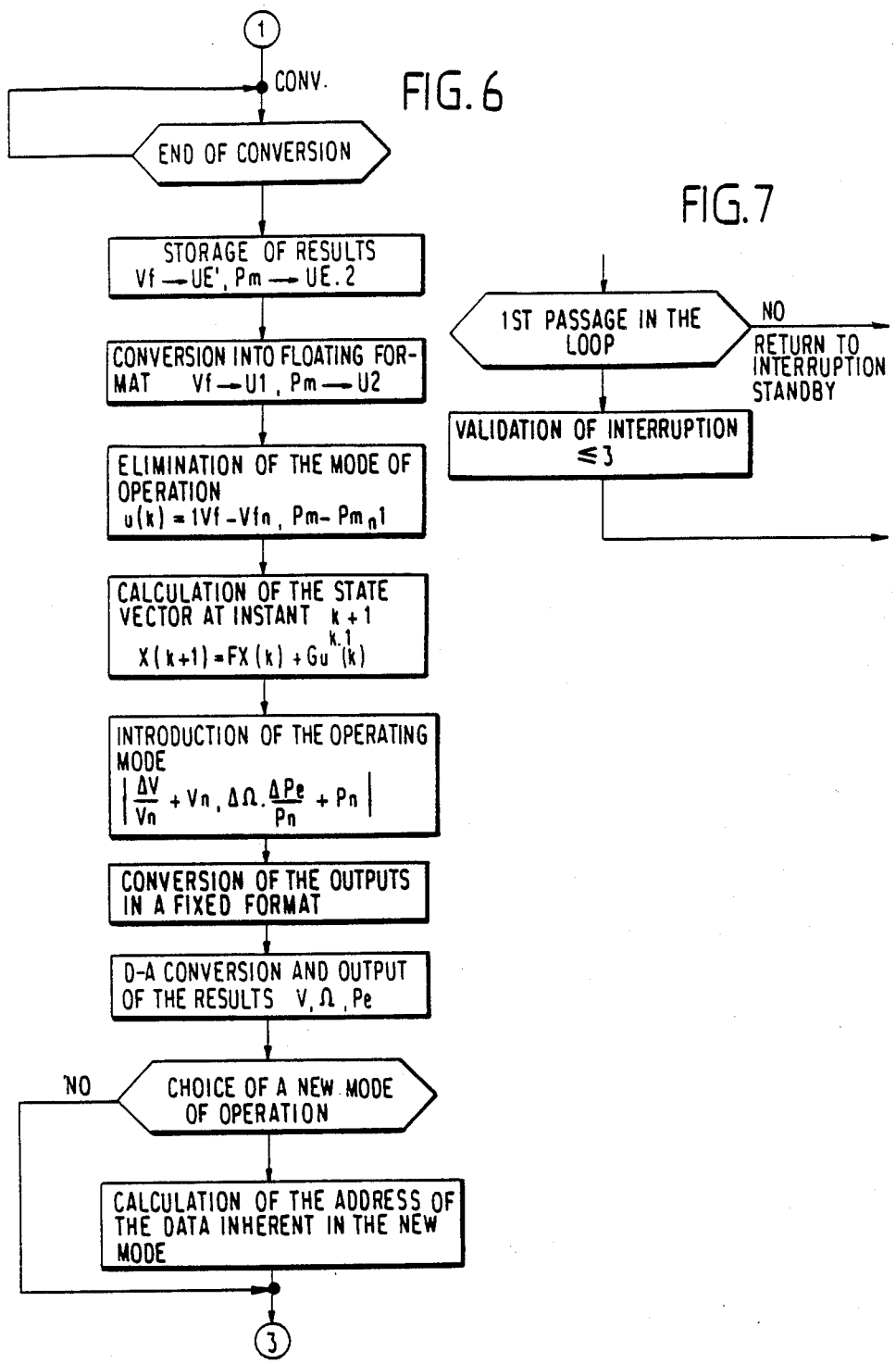

PROCESS AND DEVICE FOR SIMULATING A SYNCHRONOUS ELECTRIC MACHINE

This is a continuation of application No. 07/036,528, filed Apr. 9, 1987, abandoned.

The present invention relates to simulators of electric machines, and more particularly to a simulator of a synchronous machine employing a microprocessor.

Synchronous machine simulators are known which employ an analog computer and models of the magnetic field of the stator, of the rotor and of the air gap between the poles, connection transformers between the analog computer and said models and units imitating the rotation of the rotor.

Simulators of this type are of relatively complex construction and are adapted only for the simulation of a single type of machine.

Consequently, bearing in mind the diversity of the synchronous machines to be studied, the necessity to provide a simulator for each type of machine renders this technique prohibitively expensive.

An object of the invention is to overcome the drawbacks of the known simulators by providing a method of simulating synchronous machines which is adapted to digital calculation and which consequently permits the simulation of a synchronous machine of any type without requiring modification of the structure of the simulator.

The invention also has for an object to ensure the simulation of a regulator of a synchronous machine connected to the electric transport network so as to permit:

the development and the test of the software of the new voltage regulations of the turbo-alternator sets;

the putting into service on the sites by permitting the immediate test of the capability of the associated regulator to operate, before coupling of the alternator 2 to the real system.

The invention therefore provides a process for simulating a synchronous electric machine which comprises measuring chosen particular physical parameters of a synchronous rotating machine, combining said parameters with variables defining the nominal operation of the machine, obtaining from said physical parameters and said variables a set of coefficients of the first matrices of representation of the steady state of the machine, and obtaining from said matrices a system of equations of the steady state of the machine:

$$dX(t)/dt = A.X(t) + B.U(t)$$

$$Y(t) = C.X(t)$$

in which

X(t) is the state vector of the system, the first component $\Delta V(t)/V_n$ of which represents at instant t the relative variations of the voltage of the stator, the second component $\Delta \Omega(t)$ of which represents the variations in the speed of the synchronous machine and the third component $\Delta P_e(t)/P_n$ of which represents the relative variations of the electric power;

U(t) is the input vector of the system, the first component $\Delta V_{ex}(t)/V_{exn}$ of which represents the relative variations in the excitation voltage of the machine and the second component $\Delta P_m(t)/P_{mn}$ of which represents the relative variation in the mechanical power applied to the machine;

Y(t) is the output vector of the system, the first component $\Delta \delta'(t)$ of which represents the variations in the total internal angle between the voltage of the network and the emf of the machine, the secod component $\Delta Q_e(t)/Q_n$ of which represents the relative variations in the reactive power, the third component $\Delta I(t)/I_n$ of which represents the relative variations in the current of the stator, and the fourth and fifth components $\Delta \delta(t)$ and $\Delta \Psi(t)$ of which represent respectively the variations in the internal angle between the voltage of the stator and the emf of the machine and the variations in the transport angle between the voltage of the stator and the voltage of the network.

A better understanding of the invention will be had from the following description which is given solely by way of example with reference to the accompanying drawings, in which:

FIGS. 5 to 7 show flowcharts employing the simulation method according to the invention.

Figure 1:
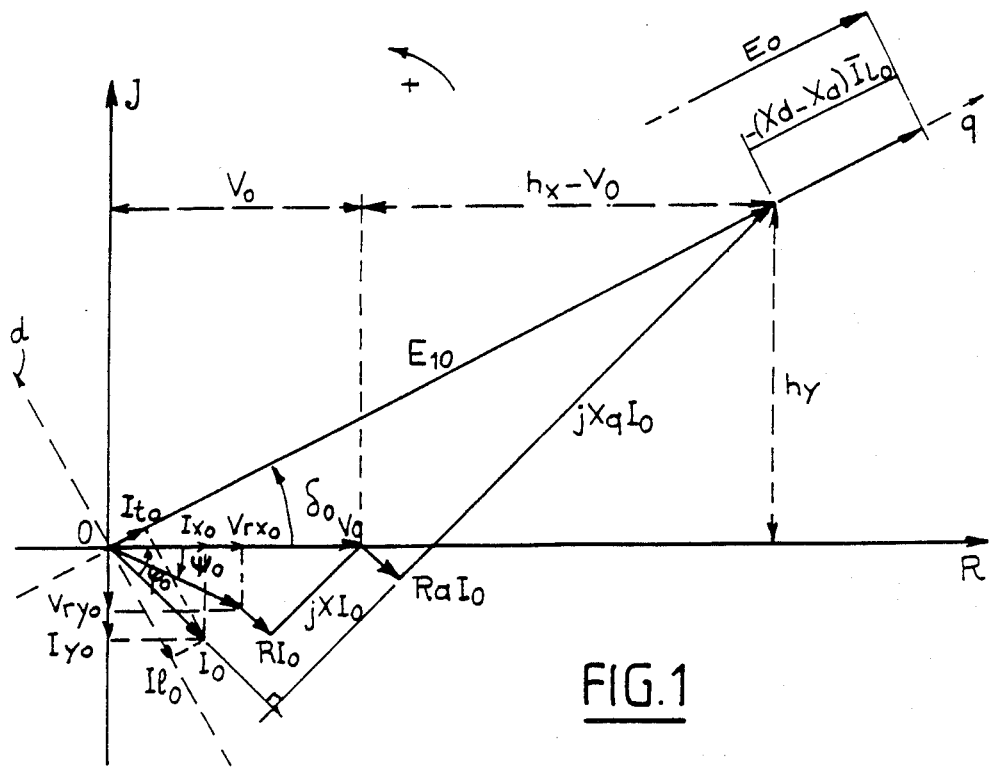
FIG. 1 is a diagram of the operation of a synchronous machine connected to the transport network.

In the following description, the invention is considered to be applied to the simulation of a turbo-alternator set.

The determination of the physical parameters of the synchronous machine which constitutes the first step of the method according to the invention is ensured by direct measurements, or by calculation.

This data is usually supplied by the constructor of the machine.

The physical parameters of an electric rotating machine are the following:

$R_a$ resistance of the armature per phase $R_f$ resistance of the field winding per phase R real part of the line impedance as seen from the terminals of the machine (section transformer + transport network)

$M_{af}$ coefficient of mutual inductance between the field and the armature $L_d, L_q$ respectively longitudinal and transverse synchronous inductances $L_f$ inductance proper of the field winding circuit L inductance proper of the line as seen from the terminals of the machine (section transformer + transport network)

$X_{af} = m_{af}\omega$ reactance associated with the mutual inductance $M_{af}$ $X_d = L_d\omega$ longitudinal synchronous reactance $X_q = L_q\omega$ transverse synchronous reactance $X = L\omega$ imaginary part of the line impedance seen from the terminals of the machine (total reactance: section transformer + transport network)

$X_t$ imaginary part of the impedance of the section transformer $X_L$ imaginary part of the impedance of the transport line $X_{cc}$ short-circuit impedance of the transport network, termed "infinity"

$X_s$ leakage reactance of the stator

J moment of inertia of the rotating masses of the turbo-alternator set $T_L$ starting up time of the turbo-alternator set $\tau'do$ longitudinal transient time constant with an open circuit $\tau'd$ longitudinal transient time constant with a short-circuit $\tau''do$ longitudinal subtransient time constant with an open circuit $\tau''d$ longitudinal subtransient time constant with a short-circuit $\tau''qo$ transverse subtransient time constant with an open circuit $\tau''q$ transverse subtransient time constant with a short-circuit $\tau kd$ magnetic circuit time constant with a short-circuit placed ficticiously on the direct axis $X'_d, X'_q$ respectively longitudinal and transverse transient reactances $X''_d, X''_q$ respectively longitudinal and transverse subtransient reactances The variables of operation of the machine are the following:

V RMS value per phase of the voltage at the stator of the alternator $V_d, V_q$ components of V along the direct axis and the quadrature axis respectively $V_{res}$ phase voltage of the electric energy transport network $V_{rd}, V_{rq}$ components along the direct axis and the quadrature axis respectively $V_{ex}$ excitation voltage of the alternator I r.m.s. value of the phase current at the stator of the alternator $I_d, I_q$ components along the direct axis and the quadrature axis respectively $I_{ex}$ field winding current of the alternator $P_e$ active electric power delivered by the alternator to the transport network $Q_e$ reactive power delivered by the alternator S apparent power of the machine $P_m$ mechanical power $C_m$ driving torque available on the shaft of the turbo-alternator set $C_e$ electric torque delivered by the alternator $\phi_d, \phi_q$ winding flux of the direct and quadrature axes respectively $\phi_f$ winding flux of the field E r.m.s. value of the electromotive force induced in the machine (emf)

$\omega'$ speed of rotation of the rotor assumed to be two-pole $\omega$ pulsation of the electric transport network (50 Hz = 100 $\pi$ rd/s)

$\Omega$ mechanical speed of the shaft of the turbo-alternator set ($\Omega = \omega'$ for a two-pole machine)

$\phi$ power factor (phase shift angle between I and V)

$\delta$ load angle or internal angle (angle between V and E)

$\delta$ load internal angle (angle between $V_r$ and E)

$\Psi$ transport angle (angle between V and $V_r$)

The significations of the indices employed in the description are the following:

kd applied to the characteristic magnitudes of the damping circuits h applied to the magnitudes intervening in the presence of a homopolar component o employed for defining the permanent initial operating mode n employed for defining the nominal operating mode The physical parameters chosen for carrying out the process are the following:

$T_L$ starting up time of the turbo-alternator set $\tau'd$ longitudinal time constant with a short-circuit $\tau'do$ longitudinal transient time constant with an open circuit $\tau''d$ longitudinal subtransient time constant with a short-circuit $X_d = L_d\omega$ longitudinal synchronous reactance $X_q = L_q\omega$ transverse synchronous reactance $X''_d$ longitudinal transient reactance $R_a$ armature resistance per phase R real part of the line impedance as seen from the terminals of the machine (section transformer + transport network)

The variables defining the nominal mode of operation of the machine are the following:

$S_n$ nominal apparent power $U_n$ nominal voltage $\cos \phi_n$ nominal power factor $\omega_n$ nominal angular frequency The second step of the method of the invention consists in the determination of the current operating mode of the machine.

For this purpose, four parameters are chosen from the following five parameters:

$V_r = V_o/V_n$ reduced value of the voltage at the stator of the machine $P_r = P_o/P_n$ reduced value of the power delivered by the machine $Q_r = Q_o/Q_n$ reduced value of the reactive power delivered by the machine $X_{line}$ imaginary part of the impedance of the transport line $V_{res}$ phase voltage of the electric energy transport network The third step of the method of the invention comprises calculating the intermediate parameters from relations given in the following table:

TABLE I

| | | |
|---|---|---|
| $\phi n =$ | $[AN^2 + (1 + BN)^2]^{\frac{1}{2}} + (x_d - x_q)\sin(\delta_n + \phi_n)$ | 1 |
| $\sin \delta_n =$ | $[AN/AN^2 + (1 + BN)^2]^{\frac{1}{2}}$ | 2 |
| $po =$ | $[AN'^2 + (HBN')^2]^{\frac{1}{2}} +$ | |
| | $(x_d - x_q)(P_r/V^2_r)(\cos \phi_n/\cos \phi_o)\sin(\delta_o + \phi_o)$ | 3 |
| $\sin \delta_o =$ | $AN'/[AN^2 + (1 + BN')^2]^{\frac{1}{2}}$ | 4 |
| $\cos \delta_o =$ | $(1 + BN')/[AN'^2 + (1 + BN')^2]^{\frac{1}{2}}$ | 5 |
| $V_{reso}/V_n =$ | $[(V_{rxo}/V_n)^2 + (V_{ryo}/V_n)^2]^{\frac{1}{2}}$ | 6 |
| with | | |
| $AN =$ | $-r_a \sin \phi_n + x_q \cos \phi_n$ | 7 |
| $BN =$ | $r_a \cos \phi_n + x_q \sin \phi_n$ | 8 |
| $AN' =$ | $-r_a \sin \phi_o \cdot I_r/V_r + x_q \cos \phi_o \cdot I_r/V_r$ | 9 |
| $BN' =$ | $r_a \cos \phi_o \cdot I_r/V_r + x_q \sin \phi_o I_r/V_r$ | 10 |
| $V_{rxo}/V_n =$ | $V_r - r \cos \phi_n \cdot P_r/V_r - x_1 \sin \phi_n \cdot Q_r/V_r$ | 11 |
| $V_{ryo}/V_n =$ | $r \sin \phi_n \cdot Q_r/V_r - x_1 \cos \phi_n \cdot P_r/V_r$ | 12 |
| $r_a =$ | $R_a/Z_n$, $r = R/Z_n$ | |
| $x_q =$ | $X_q/Z_n$, $x_d = X_d/Z_n$, $x_1 = X/Z_n$ | |
| $Z_n =$ | $3V^2_n/S_n$ | |

All the parameters defined hereinbefore and intervening in the representation of the synchronous machine in the state space are computed from the physical data:

$T_L, \tau'd, \tau'do, \tau''dd, X_d, X_q, X''_d$ and from the chosen operating point given by the four variables:

$$V_o, P_o, Q_o, X$$

These calculations are carried out by means of a suitable program.

By means of a second algorithm, there are then determined the coefficients forming the matrices A, B and C of the simplified state model of the machine.

The representation of the synchronous machine in the state space has a double interest.

Owing to its simplicity, it permits the mathematical study of the new voltage regulations and facilitates the physical realization of a turbo-alternator set simulator.

The matrices A, B and C are given by the following expressions:

$$A = \begin{vmatrix} a_{11} & a_{12} & a_{13} \\ 0 & -D & -H \\ a_{31} & a_{32} & a_{33} \end{vmatrix} \quad 13 \qquad B = \begin{vmatrix} b_{11} & 0 \\ 0 & H \\ b_{31} & 0 \end{vmatrix} \quad 14$$

$$C = \begin{vmatrix} c_{11} & 0 & c_{13} \\ c_{21} & 0 & c_{23} \\ c_{31} & 0 & c_{33} \\ c_{41} & 0 & c_{43} \\ c_{51} & 0 & c_{53} \end{vmatrix} \quad 15$$

The square matrix A (3×3) is in concordance with the number of state magnitudes. It is determinant for the dynamic behaviour of the system, particularly as concerns the proper values.

It is termed the matrix of the system or fundamental matrix.

The rectangular matrix B (3×2) is in concordance with the number of state magnitudes (3) and the number of input magnitudes (2).

Consequently, this matrix is termed the input matrix.

The elements $b_{ij}$ of this matrix give the relation between the various input magnitudes and the state magnitudes The rectangular matrix C (5×3) is in concordance with the number of output magnitudes (5) and the number of state magnitudes (3).

The elements $C_{ij}$ of this matrix, termed output matrix, give the relation between the state magnitudes and output magnitudes.

The coefficients $a_{ij}$, i=1,3, j=1,3; $b_{ij}$, i=1,3, j=1,2 and $c_{ij}$ i=1,5, j=1,3 of the respective matrices A, B and C are given in the following table:

TABLE II

| | |
|---|---|
| $a_{11} = \alpha h_3/\tau h_1 = h_3 a_{31}$ | $a_{31} = \alpha/\tau h_1$ |
| $a_{12} = h_1 + \beta h_3/\tau = h_1 + h_3 a_{32}$ | $a_{32} = \beta/\tau$ |
| $a_{13} = -h_3(1 + \alpha h_3/h_1)/ = h_3 a_{33}$ | $a_{33} = -(1 + \alpha h_3/h_1)/\tau$ |
| $b_{11} = \gamma h_3/\tau = h_3 b_{31}$ | $b_{31} = \gamma/\tau$ |
| $c_{11} = h^{-1}$ | $c_{13} = -h_3 c_{11}$ |
| $c_{21} = h_1 Q h^{-1}$ | $c_{23} = h_3 Q - h_3 c_{21}$ |
| $c_{31} = h_1 I h^{-1}$ | $c_{33} = h_3 I - h_3 c_{31}$ |
| $c_{41} = h_1 \delta h^{-1}$ | $c_{43} = h_3 \delta - h_3 c_{41}$ |
| $c_{51} = h_1 \Psi h^{-1}$ | $c_{53} = h_3 \Psi - h_3 c_{51}$ |

Determination of the parameters intervening in the state representation.

(a) General expressions

The expression of the parameters $\alpha, \beta, \gamma \ldots$ intervening in the coefficients of the matrices A, B and C of the simplified state representation of the synchronous machine are recalled in table III.

The writing conventions adopted are the following:

| | | |
|---|---|---|
| $X = L\omega$ | | 16 |
| $x_1 = X (p.u.) = X (\Omega)/Z_n$ | | 17 |
| and | | |
| $Z_n = 3 V^2_n/S_n$ | | 18 |
| $x = X/X_d$ | 2-17 (x' = X/X_q) | 19 |
| $x_d = X_d/Z_n$ | 2-19 $(x_q = X_q/Z_n)$ | 20 |
| $\rho o = E_o/V_o$ | 2-21 $(\rho n = E_n/V_n)$ | 21 |

The relation (17) defines by convention the passage of the real values using the units of the international measuring system (i.m.s) to the reduced values without dimensions, expressed as percent (p.u.=per unit).

The parameters intervening in the coefficients of the matrices A, B and C of the simplified state model of the synchronous machine connected to a transport network of infinite power are given in the following table:

TABLE III $$\alpha = \left(\frac{V_o}{V_n}\right)^2 \frac{1}{x_d \cos\phi_n} \left[ \frac{(\cos\delta_0 (1 + x) - x\rho_0)(\cos\delta_0 (x^1 - x) + x\rho_0)}{x(1 + x^1)} - \frac{\sin^2\delta_0 (1 + x^1)(x^1 - x)}{x(1 + x)} \right] \quad 1$$

$$\beta = \left(\frac{V_o}{V_n}\right)^2 \frac{1}{x_d \cos\phi_n} \left[ \frac{(\cos\delta_0(1 + x) - x\rho_0)(\cos\delta_0(x^1 - x) + x\rho_0)\tau}{x(1 + x^1)} + \frac{\sin^2\delta_0(1 + x^1)(x\tau'_{do} - x^1\tau'_d)}{x(1 + x)} \right] \quad 2$$

$$\gamma = \left(\frac{V_o}{V_n}\right)\rho n \frac{1}{x_d \cos\phi_n} \left[ \frac{1 + x^1}{1 + x} x\sin\delta_0 \right] \quad 3$$

$$\tau = (x\tau'_{do} + \tau'_d)/(1 + x) \quad 4$$

$$H = \omega_o/T_L \quad 5$$

$$D = H\tau''_d(V_{res}/V_n)^2/(x_d\cos\phi_N)(x + x''_d/x_d) \quad 6$$

$$7$$

$$h_1 = -\left(\frac{V_o}{V_n}\right) \frac{(x\rho_0 + \cos\delta_0(x^1 + x))}{(1 + x^1)^2 \sin\delta_0} (1 + x \cos^2\delta_0 + x^1\sin^2\delta_0 - x\rho_0\cos\delta_0)$$

$$8$$

$$h_3 = \left(\frac{V_n}{V_o}\right) x_d \cos\phi_n \cdot \frac{x}{1 + x^1} \cdot \frac{\cos\delta_0}{\sin\delta_0}$$

TABLE III-continued $$h_{1Q} = \left(\frac{V_o}{V_n}\right)^2 \frac{1}{x_d \sin\phi_n} \frac{(x\rho_0 + \cos\delta_0(x^1 - x))}{x(1 + x^1)^2 \sin\delta_0} (1 - x^2(\rho_0 - \cos\delta_0)^2 - x^{12}\sin^2\delta_0) \quad 9$$

$$h_{3Q} = \frac{\cos\phi_n}{\sin\phi_n} \frac{(\cos\delta_0(1-x) + x\rho_0)}{(1+x^1)\sin\delta_0} \quad 10$$

$$h_{1I} = \left(\frac{V_o}{V_n}\right)\frac{1}{x_d} \frac{(x\rho_0 + \cos\delta_0(x^1 - x))((1+x^1)x^1\sin^2\delta_0 + (1+x)x\cos^2\delta_0 +}{x^2(1+x^1)^2} \quad 11$$

$$\frac{-x\rho_0\cos\delta_0(1+2x) + x^2\rho_0^2)}{\sqrt{(\rho_0 - \cos\delta_0)^2 + \left(\frac{x^1}{x}\right)^2 \sin^2\delta_0}}$$

$$h_{3I} = \left(\frac{V_n}{V_o}\right)\frac{\cos\rho n(\rho_0 - \cos\delta_0)}{(1+x^1)\sin\delta_0 \sqrt{(\rho_0 - \cos\delta_0)^2 + \left(\frac{x^1}{x}\right)^2 \sin^2\delta_0}} \quad 12$$

$$h_1 = 1 - \frac{(x\rho_0 + \cos\delta_0(x^1 - x))^2}{(1+x^1)^2} \quad 13$$

$$h_{3\delta} = -\left(\frac{V_n}{V_o}\right)^2 x_d \cos\rho n \frac{x}{1+x^1} \quad 14$$

$$h_{1\psi} = \frac{(x\rho_0 = \cos\delta_0(x^1 - x))^2}{(1+x^1)^2} \quad 15$$

$$h_{3\psi} = \left(\frac{V_n}{V_o}\right)^2 x_d \cos\rho n \frac{x}{1+x^1} \quad 16$$

There will be noted, for this type of network, the strict identity between the speed of rotation of the turbo-alternator set in the steady mode $\omega_o$ and the angular frequency of the electric transport network.

Note also that, for the determination of the parameter D, the identity has been assumed for the subtransient reactances $X''_d$ and $X''_q$ (or $x''_d$ and $x''_q$) along the two longitudinal and transverse axes.

(b) Simplified expressions

In the case where the longitudinal and transverse synchronous reactances $X_d$ and $X_q$ are identical, the formula established in table III are advantageously simplified.

This approximation can be perfectly well envisaged in practice for many machines having smooth poles. The simplified expressions for the parameters are obtained simply by employing the equation:

$$x = x'$$

in the expressions of table III.

The simplified expressions obtained are given in the following table IV.

TABLE IV

HYPOTHESIS $X_d = X_q$

| | | |
|---|---|---|
| $\alpha =$ | $(V_o/V_n)^2 \rho_o(\cos\delta_o \cdot (1+x) - x\rho_o)/(1+x)x_d\cos\phi_n$ | 1 |
| $\beta =$ | $\alpha\tau + (V_o/V_n)^2 \sin^2\delta_o \cdot (\tau'_{do} - \tau'_d)/x_d\cos\phi_n$ | 2 |
| $\gamma =$ | $(V_o/V_n) \rho_n\sin\delta_o x_d\cos\phi_n = (V_o/V_n) \sin\delta_o \sin\delta_n$ | 3 |
| $\tau =$ | $(x\,\tau'_{do} + \tau'_d)/(1+x)$ | 4 |
| $H =$ | $\omega_o/T_L = P_o/J\,\omega_o$ | 5 |
| $D =$ | $H\,\tau\Delta_d(V_{reso}/V_n)^2/x_d\cos\rho_n \cdot (x + x\Delta_d/x_d)$ | 6 |
| $h_1 =$ | $-(V_o/V_n)x\,\rho_o(1+x-x\,\rho_o\cos\delta_o)/(1+x)^2 \sin\delta_o$ | 7 |
| $h_3 =$ | $x_d\cos\rho_n \cdot x\cos\delta_o/(V_o/V_n)(1+x)\sin\delta_o$ | 8 |
| $h_{1Q} =$ | $-(V_o/V_n)^2 x\,\rho_o[1 - x^2(1+\rho_o^2 - 2\rho_o\cos\delta_o)]/x_d\sin\phi_n \cdot x(1+x)^2 \sin\delta_o$ | 9 |
| $h_{3Q} =$ | $\cos\phi_n \cdot [(1-x)\cos\delta_o + x\,\rho_o]/\sin'\rho_n(1+x)\sin\delta_o$ | 10 |
| $h_{1I} =$ | $(V_o/V_n) x\,\rho_o[(1+x)x + x\,\phi_o[x\,\rho_o - \cos\delta_o \cdot (1+2x)]]/$ | |
| | $x_dx^2 (1+x)^2 (1+\rho_o - 2\rho_o\cos\delta_o)\downarrow$ | 11 |
| $h_{3I} =$ | $\cos\rho_n \cdot (\rho_o - \cos\delta_o)/(V_o/V_n)(1+x)\sin\delta_o(1+\rho_o - 2\rho_o\cos\delta_o)\downarrow$ | 12 |
| $h_{1\delta} =$ | $1 - [x\,\rho_o/(1+x)]^2$ | 13 |
| $h_{3\delta} =$ | $-x_d\cos\phi_n \cdot x/(V_o/V_n)^2(1+x)$ | 14 |
| $h_{1\psi} =$ | $[x\,\rho_o/(1+x)]^2$ | 15 |
| $h_{3\psi} =$ | $x_d\cos\phi_n \cdot x/(V_oV_n)^2(1+x)$ | 16 |

(c) Function of the various parameters

The functions performed by the main parameters given in table III are briefly recalled here.

| | |
|---|---|
| α | synchronizing power if positive: an increase in the stator voltage is favourable thereto |
| β | synchronizing power if positive. It in this case performs the function of a damper as concerns electromechanical oscillations. An increase in the stator voltage is favourable thereto: at high electric power, this coefficient rapidly decreases with increase in the total reactance of the connection and may even become negative. |
| γ | image of the action of a variation in the excitation voltage on the electric power: the action increases with increase in the electric power delivered |
| τ | time constant of the establishment of the flux in the synchronous machine: increases with the length of the line |
| H | measurement of the "nominal" acceleration of the turbo-alternator set in rd/s² |
| D | damping coefficient: decreases with the line length |
| $h_1$ | will perform an important function in the stator voltage regulation. If this coefficient is negative, the re-injection of voltage will create a synchronizing torque which is favourable to the stability of the turbo-alternator set |
| $h_3$ | translates the interaction of the relative difference of active power on the relative difference of voltage. |

DETERMINATION OF THE INTERMEDIATE VARIABLES

(a) Intervention of the auxiliary variables

To completely define the state model proposed hereinbefore, it is finally necessary to find the literal expressions of the magnitudes $\rho_o, \rho_n, \sigma_o, \sigma_n$ characterising the operating mode of the synchronous machine and of the ratio $V_{res}/V_n$ defining the state of the electric transport network. These intermediate variables intervene in the determination of the parameters $\alpha, \beta \ldots$ as shown in tables III and IV. For this purpose, there is adopted the diagram of operation of the synchronous machine connected to the transport network (or BLONDEL diagram) represented in FIG. 1.

(b) Characteristics of the machine

Nominal operation mode

Figure 2:
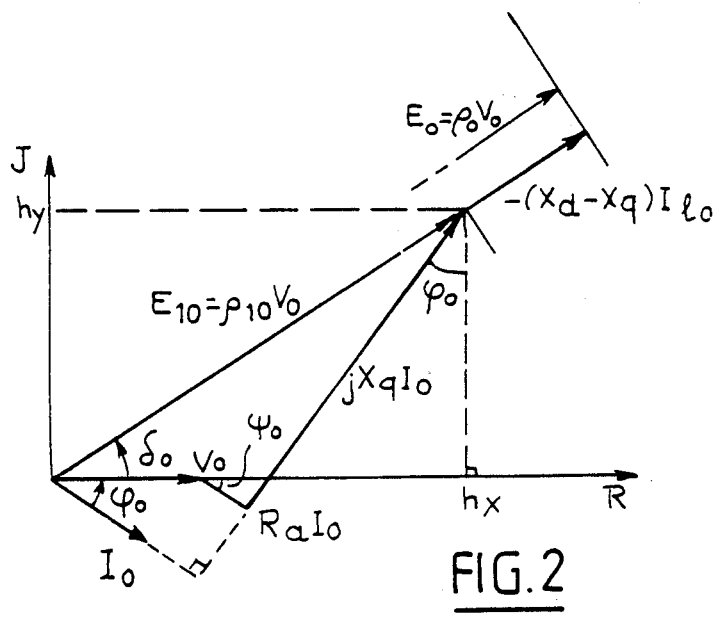
FIG. 2 is a diagram of the operation of a synchronous machine uncoupled from the electric transport network.

The diagram of operation of the sycnhronous machine uncoupled from the transport network is represented in FIG. 2.

The diagram of operation in the nominal mode and in reduced variables is easily obtained by dividing all the magnitudes of FIG. 2 by the nominal stator voltage $V_n$. The vectorial representation in FIG. 3a results, in which $r_a$ and $x_q$ are respectively the reduced values of $R_a$ and $X_q$ by using the conventional definitions.

$$r_a = R_a/Z_n$$

$$x_q = X_q/Z_n$$

with
$$R_a(\Omega) = r_a(\%) \cdot Z_n$$

This passage is immediate by noting the first expressions:

$$R_a \frac{I_n}{V_n} \text{ and } x_q \frac{I_n}{V_n}$$

with $$\frac{I_n}{V_n} = \frac{P_n}{3V_n^2 \cos\phi_n} = \frac{S_n}{U_n^2} = Z_n^{-1}$$

Figure 3:
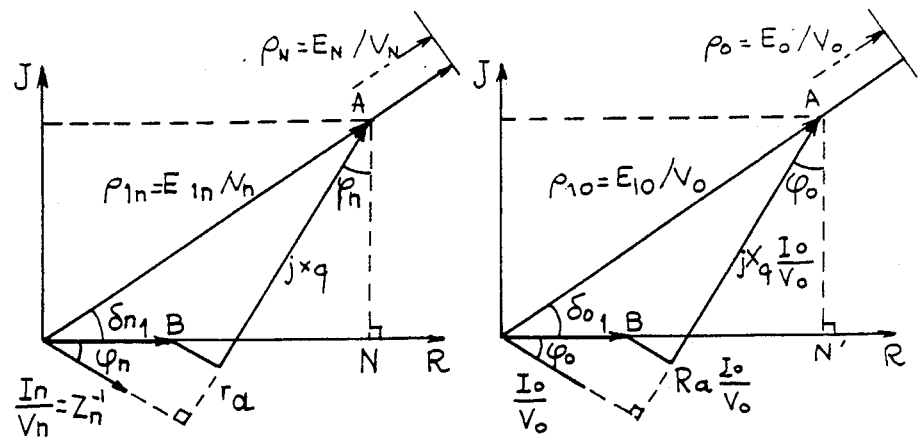
FIGS. 3A and 3B are vectorial representations in reduced magnitudes of the diagram of FIG. 2.

From the vectorial representation in reduced values of FIG. 3, there are taken the relations defining the nominal internal angle $$\cos\delta_n = (1 + BN)/P_{1n} \quad 2.32$$
and
$$\sin\delta_n = AN/P_{1n} \quad 2.33$$

Likewise, there is taken from the diagram of FIG. 2 the expression of the rated e.m.f.:

$$E_n = E_{1n} - (X_d - X_q)I_{1n} \quad 2.34$$
namely:
$$E_n = E_{1n} + (X_d - X_q)I_n \sin(\delta_n + \phi_n) \quad 2.35$$

taking into account the relation between currents $$I_1 = I \sin(\sigma + \phi) \quad 2.36$$

The passage to the reduced magnitudes is easily effected by dividing the terms of equation 2.35 by the nominal stator voltage.
There is then obtained:

$$\rho_n = \rho_{1n} + (x_d - x_9)\sin(\sigma_n + \phi_n) \quad 2.38$$

Current operation mode

For any operating point indexed "o", the same type of diagram as before in reduced values may be obtained from FIG. 2. For this purpose, it is sufficient to divide all the characteristic magnitudes by the current stator voltage $V_o$. The result is shown at b in FIG. 3.

There are reached the following relations defining the internal angle $$\sin\delta_o = AN'/\rho_{lo} \quad 2.51$$

$$\cos\delta_o = (1 + BN')/\rho_{lo} \quad 2.52$$

In using the same procedure as before, the e.m.f. delivered by the machine has for expression $$E_o = E_1 - (X_d - X_q)I_{lo} \quad 2.53$$

The required expression is taken from this expression, namely $$\rho_0 = \rho_{10} + (x_d - x_q)(P_r/V_r^2)(\cos\phi_n/\cos\phi_0) \quad 2.57$$
$$\sin(\delta_0 + \phi_0)$$

The magnitudes $(h_x - v_o)$ taken from the diagram of operation of the synchronous machine shown in FIG. 1 are directly proportional to the active and reactive powers respectively.

Indeed, the following relations may be deduced from the diagrams of FIGS. 1 to 3:

$$P_0 h_y 3 V_0/X_q 3 E_{10} V_0 \sin\delta_0/X_q \quad 2.73$$
$$Q_0(h_x - Y_0) 3 V_0/X_q (E_{10} \cos\delta_0 - V_0) 3 V_0/X_q \quad 2.74$$

(c) Characteristics of the Network

The transport network is governed by relations directly taken from the diagram shown in FIG. 1, namely:

$$X_{rxo} = V_o - R\, I_x + X\, I_{yo} \quad \quad 2.75$$

$$V_{ryo} = -X\, I_{xo} - R\, I_{yo} \quad \quad 2.76$$

whence the following relation after passing to reduced variables:

$$(V_{reso}/V_n) = [(V_{rxo}/V_n)^2 + (V_{ryo}/V_n)^2]^{\frac{1}{2}} \quad \quad 2.81$$

With the matrices A, B, C whose determination has just been described in particular with reference to the diagrams of FIGS. 1 to 3, the continuous state model of the synchronous machine is defined $$d[X(t)]/\cdot dt = A \cdot X(t) + B \cdot U(t)$$
$$Y(t) = CX(t)$$

Then the matrices F and G required for the program incorporated in the simulator are calculated by means of the following relations:

$$F = \exp(AT)$$
$$G = A^{-1}[1 - \exp(AT)]B$$

in which:
- exp = matrix exponential
- T = sampling step
- I = unitary matrix

Figure 4:
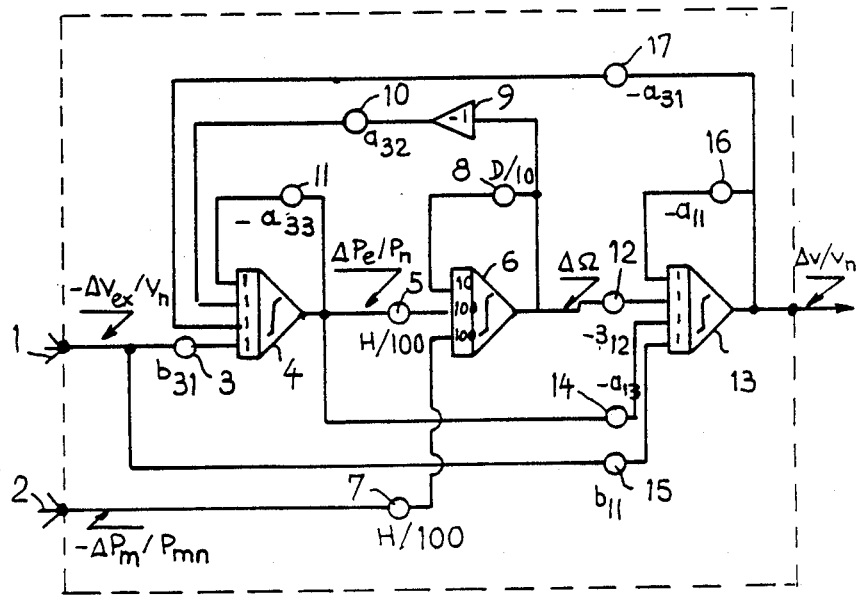
FIG. 4 is an electric diagram of an analog simulator for carrying out the method of the invention.

The analog simulator represented in FIG. 4 enables the method of the invention to be carried out for obtaining the matrices A, B and C and the steady state model of the synchronous machine to be simulated.

It constitutes an analog simulator of the simplified state model of the machine.

This simulator comprises two inputs 1 and 2, to which are respectively applied electric signals representing the values $$-V_{ex}/V_n \text{ and } -\Delta P_m/P_{mn}$$

The input 1 is connected through a gain element 3 representing the coefficient $b_{31}$ of the matrix B which delivers at its output a signal connected to an input of an integrator 4 having four inputs. The output of the integrator 4 is connected through an element 5 having a gain equal to H/100, H being the value of the coefficient $b_{22}$ of the matrix B and the opposite of the coefficient $a_{23}$ of the matrix A, to an input of an integrator 6 having three inputs whose second input is connected through a gain element 7 to the input 2 of the circuit, and whose output is connected to its third input through a gain element 8 equal to the coefficient D/10, D being the opposite of the coefficient $a_{22}$ of the matrix A.

The output of the integrator 6 is moreover connected through an inverting switch 9 and a gain element 10 establishing the coefficient $a_{32}$ of the matrix A, to a second input of the integrator 4. The output of this integrator is moreover connected to a third of its inputs through a gain element 11 establishing the coefficient $a_{33}$ of the matrix A. The output of the integrator 6 which delivers a signal corresponding to $\Delta\Omega$ is connected through a gain element 12 establishing the coefficient $-a_{12}$ of the matrix A, to an input of an integrator 13 having four inputs. A second input of the integrator 13 is connected to the output of the integrator 4 through a gain element 14 establishing the coefficient $-a_{13}$ of the matrix A. A third input of the integrator 13 is connected to the input 1 of the circuit through a gain element 15 establishing the coefficient $b_{11}$ of the matrix B. The fourth input of the integrator 13 is connected to its output through a gain element 16 establishing the coefficient $-a_{11}$ of the matrix A.

The output of the integrator 13 is moreover connected to a fourth input of the integrator 4 through a gain element 17 establishing the coefficient $-a_{31}$ of the matrix A.

The integrators which are part of the construction of the circuit of FIG. 4 are made from operational amplifiers.

The output of each of the integrators simulates the respective state variable and its input simulates its derivative, but of opposite sign since the operational amplifiers invert the sign. The adjustable gains to be set are produced by linear potentiometers.

As the coefficients D and H intervening in the matrices A and B of the state model are greater than unity, gains of 10 and 100 respectively appear on the inputs of the concerned integrator operational amplifiers. Other coefficients are preceded by a minus sign since the potentiometers represent only positive gains.

Note moreover that the two inputs $\Delta V_{ex}/V_n$ and $\Delta P_m/P_{mn}$ are negative so as to respect the sign of the output magnitudes $\Delta V/V_n$, $\Delta\Omega$ and $\Delta P_e/P_n$.

The signal $\Delta V/V_n$ appears at the output of the integrator 13 which constitutes the output of the analog simulator.

The signal $\Delta P_e/P_n$ appears at the output of the integrator 4.

Thus it can be seen that there is obtained with the circuit just described from the input vector $$U(t) = \begin{vmatrix} V_{ex}(t)/V_{exn} \\ P_m(t)/P_{mn} \end{vmatrix}$$

the state vector $$X(t) = \begin{vmatrix} \Delta V(t)/V_n \\ \Delta\Omega(t) \\ \Delta P_e(t)/P_n \end{vmatrix}$$

signals representing the three components of this vector respectively appearing at the outputs of the integrators 13, 6 and 4.

The vector Y(t) is obtained by multiplication of the vector X(t) by the matrix C.

Figure 5:
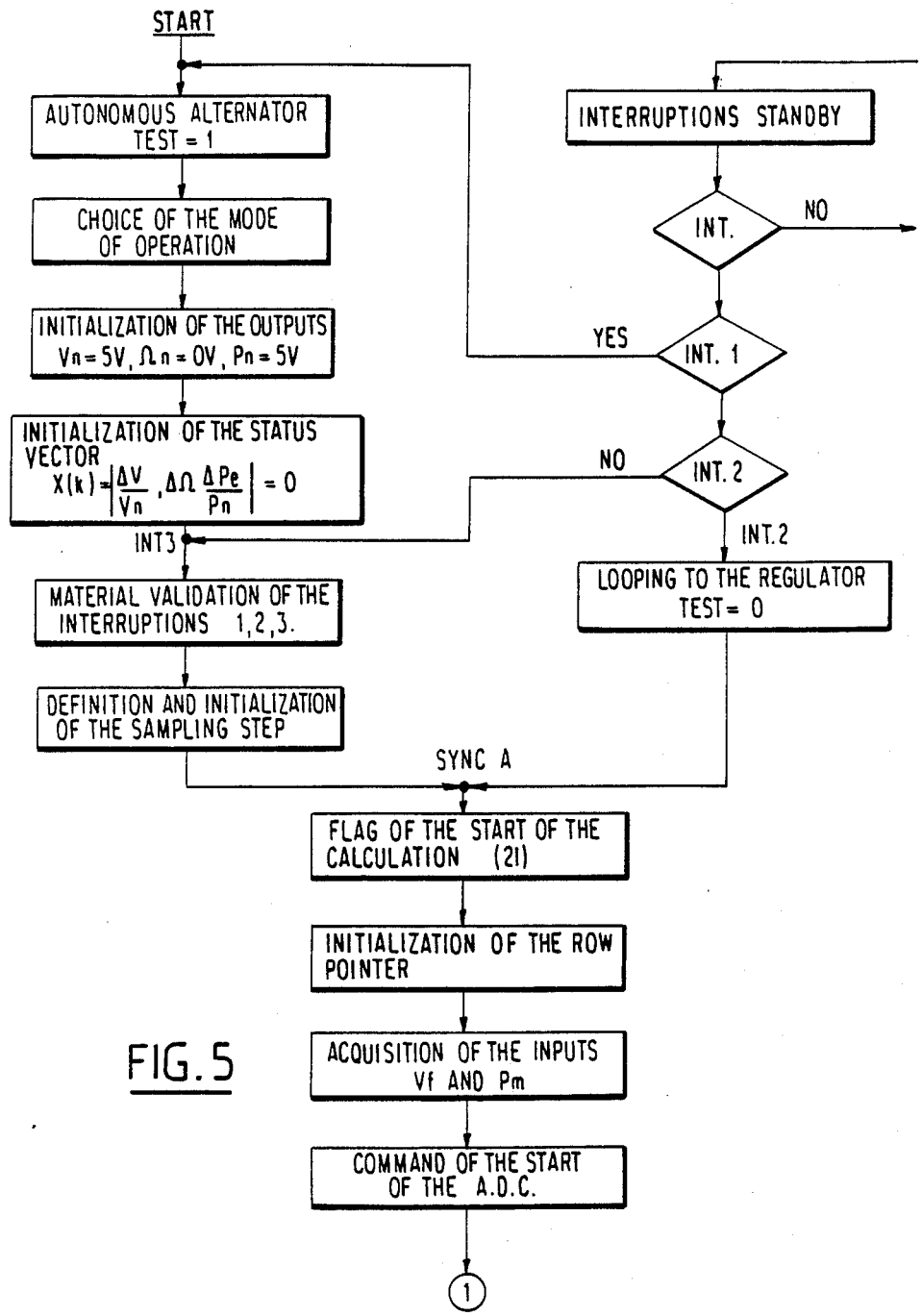

The simulation method according to the invention is implemented digitally according to the flowchart shown in FIGS. 5 to 7.

This flowchart is the illustration of a program incorporated in a 16 bits microprocessor, for example of the type TMS9900 of Texas Instruments.

According to this flowchart, the autonomous alternator is first of all tested as shown in FIG. 5.

The test signals produced by the microprocessor are in particular the calculation time, the display of the sampling step etc.

If this test is conclusive, the mode of operation of the machine is selected.

The mathematical modulation described hereinbefore is a modulation of the alternator-network system with small variations. To produce a simulation in real size, the characteristics of the point of operation to be considered must be introduced at the inputs/outputs.

For reasons of compatibility with other available models, the representation of the nominal mode of operation of the synchronous machine is defined by the following analog values.

Stator voltage $V_n = 5$ V
Velocity of the area $\Omega_n = 0$ V
Electric power $P_{en} = 5$ V
Excitation voltage $V_{fn} = 5$ V
Mechanical power $P_{mn} = 5$ V In order to be able to simulate disturbances of large amplitudes, it is necessary to define a plurality of operating points and associate therewith the numerical values of the parameters of the corresponding mathematical model.

Sets of parameters corresponding to sixteen operating modes are entered in read-only memories associated with the microprocessor.

Selection of a specific set is effected by means of a knurled knob and a toggle switch (not shown) provided on the front of the simulator.

Then one proceeds to the initialization stage of the outputs $V_n = 5$ V, $\Omega_n = 0$ V, $P_n = 5$ V and, in the course of the following stage, to the initialization of the state vector $X(k) = |\Delta V/V_n, \Delta\Omega, \Delta P_e/P_n| = 0$.

The following stage is the validation of the interruptions 1, 2 and 3, reference to which will be made hereinafter.

Thereafter, the definition and the initialization of the sampling step are effected.

Then, after setting a flag indicating beginning of the calculation and the initialization of the stack pointer, the inputs Vf and Pm representing U(k) are acquired.

There then intervene the operations controlling the analog-digital conversion of the input data.

The subsequent operations are illustrated in FIG. 6 in which are shown the analog-digital conversion stage and the checking of the end of the conversion.

The results of the conversion, namely $V_f \rightarrow UE$ et $P_m \rightarrow UE+2$ are stored in the memory.

The stored data are converted into the floating format $V_f \rightarrow U_1$, $P_m \rightarrow U_2$.

The following stage consists in the elimination of the operating mode by suppression of the continuous component to obtain:

$$u(k) = |V_f - V_{fn}, P_m - P_{mn}|$$

Then, the state vector at instant $K+1$ $X(K+1) = FX(k) + Gu(k)$ is computed.

In the course of the following stage, the operating mode reintroduced by adding the continuous component:

$$\left| \frac{\Delta V}{V_n} + V_n \cdot \Delta\Omega \cdot \frac{\Delta P_e}{P_n} + P_n \right|$$

The outputs obtained are then converted by returning to the full format from the point floating format.

Then the digital values of the results of the preceding operation are converted into analog values to obtain the values of V, $\Omega$ and $P_e$.

This operation is optionally followed by an interrogation relating to the choice of a new operating mode.

If the reply is in the affirmative, the address of the internal data of the new operating mode is calculated.

If the reply is in the negative, one passes directly to the step of the flag of the end of the calculation of FIG. 7.

This stage is followed by an interrogation relating to the first passage in the loop.

In the affirmative, there is a validation of the interruption as long as the interruption index is less than or equal to 3.

In the opposite case, there is a return to interruption standby (FIG. 5).

In this way, it has been possible to simulate the operation of the synchronous machine from various operating modes stored in the memory and addressed in succession in the course of the carrying out of the program.

What is claimed is:

1. An analog simulator for simulating the state of an electrical synchronous electric rotating machine whose behaviour in steady state condition may be represented by a set of steady state equations:

$$d/X(t)/ /dt = A.X.(t) + B.U.(t)$$

$$Y(t) = C.X(t)$$

in which
X(t) is a state vector having three components constituting state parameters of an alternator, a first component $\Delta V(t)/V_n$ representing at instant t the relative variation of the voltage of the stator, a second component $\Delta\Omega(t)$ representing variations of the speed of the synchronous machine, and a third component $\Delta P_e(t)/P_n$ representing the relative variations of the electric power;

U(t) is an input vector having two components constituting input parameters of operation, consisting of a first component $\Delta V_{ex}(t)/V_{exn}$ representing the relative variations of the excitation voltage of the machine, and a second component $\Delta P_m(t)/P_{mn}$ representing the relative variation of the mechanical power applied to the machine;

Y(t) is an output vector having components constituting output parameters of operation, consisting of a first component $\Delta\delta'(t)$ representing the total internal angle variations between the voltage of the network and the e.m.f. of the machine, a second component $\Delta Q_e(t)/Q_n$ representing the relative variations of the reactive power, a third component $\Delta I(t)/I_n$ representing the relative variations of the current of the stator, and a fourth and a fifth components $\Delta\rho(t)$ and $\Delta\Psi(t)$ respectively representing the variations of the internal angle between the voltage of the stator and the e.m.f. of the machine and the variations of the transport angle between the voltage of the stator and the voltage of the network.

and A, B and C are matrices whose coefficients are selected to define the relations between the state parameters in a specific alternator, the relations between the state parameters and the input parameters in said specific alternator and the relations between the state parameters and the output parameters in said specific alternator, respectively, comprising a cascaded arrangement of first integrator means, second integrator means and third integrator means, said first integrator means having a plurality of inputs one of which is connected to receive an electrical signal representing said first component of the input vector and the other of which are connected to receive, through respective amplifying means, the outputs of said first integrator means, of said second integrator means and of said third integreator means and being arranged to deliver an electrical output signal representative of said third component of the state vector on an output thereof, said second integrator means having a plurality of inputs, comprising a first input connected to receive the output of said first integrator means, a second input connected to provide a feedback signal from the output of said second integrator means and a third input connected to receive an electrical signal representative of said second component of the input vector and being constructed to deliver an electrical output signal representative of said second component of the state vector on an output thereof, said third integrator means having a plurality of inputs respectively connected to receive the output of said second integrator means, a feedback loop from the output of said third integrator means, the output from said first integrator means and said signal representative of said first component of the input vector and being constructed to deliver an electrical output signal representative of said first component of the state vector; and means for delivering the components of said output vector from the outputs of said first, second and third integrator means.

2. An analog simulator for simulating the state of an electrical synchronous electric rotating machine whose behaviour in steady state condition may be represented by a set of steady state equations:

$$d/X(t)/ /dt = A.X.(t) + B.U.(t)$$

$$Y(t) = C.X.(t)$$

in which

X(t) is a state vector having three components constituting state parameters of an alternator, a first component $\Delta V(t)/V_n$ representing at instant t the relative variation of the voltage of the stator, a second component $\Delta\Omega(t)$ representing variations of the speed of the synchronous machine, and a third component $\Delta P_e(t)/P_n$ representing the relative variations of the electric power;

U(t) is an input vector having two components constituting input parameters of operation, consisting of a first component $\Delta V_{ex}(t)/V_{exn}$ representing the relative variations of the excitation voltage of the machine, and a second component $\Delta P_m(t)/P_{mn}$ representing the relative variation of the mechanical power applied to the machine;

Y(t) is an output vector having components constituting output parameters of operation, consisting of a first component $\Delta\delta'(t)$ representing the total internal angle variations between the voltage of the network and the e.m.f. of the machine, a second component $\Delta Q_e(t)/Q_n$ representing the relative variations of the reactive power, a third component $\Delta I(t)/I_n$ representing the relative variations of the current of the stator, and a fourth and a fifth components $\Delta\rho(t)$ and $\Delta\gamma(t)$ respectively representing the variations of the internal angle between the voltage of the stator and the e.m.f. of the machine and the variations of the transport angle between the voltage of the stator and the voltage of the network, and A, B and C are matrices whose coefficients are selected to define the relations between the state parameters in a specific alternator, the relations between the state parameters and the input parameters in said specific alternator, respectively, comprising a cascaded arrangement of first integrator means, second integrator means and third integrator means, said first integrator means having a plurality of inputs one of which is connected to receive said first component of the input vector and being constructed and having its other inputs so connected as to deliver an electrical output signal representative of said third component of the state vector on an output thereof;

said second integrator means having a first input connected to receive the output of the first integrator means and being constructed and having other inputs so connected as to deliver an electrical output signal representative of said second component of the state vector on an output thereof, and said third integrator means having a first input connected to receive the output of said second integrator means and being constructed and having its other inputs connected so as to deliver an electrical output signal representative of said first component of the state vector.

* * * * *